US009274006B2

United States Patent
Nitobe et al.

(10) Patent No.: US 9,274,006 B2
(45) Date of Patent: Mar. 1, 2016

(54) INFRARED SENSOR

(71) Applicant: NEC TOKIN CORPORATION, Sendai-shi, Miyagi (JP)

(72) Inventors: Yuji Nitobe, Sendai (JP); Masahiro Saito, Sendai (JP); Shigemi Fujiwara, Sendai (JP); Akitoshi Shimo, Sendai (JP)

(73) Assignee: NEC TOKIN CORPORATION, Sendai-Shi, Miyagi (JP)

( * ) Notice: Subject to any disclaimer, the term of this patent is extended or adjusted under 35 U.S.C. 154(b) by 108 days.

(21) Appl. No.: 13/959,479

(22) Filed: Aug. 5, 2013

(65) Prior Publication Data
US 2014/0042321 A1    Feb. 13, 2014

(30) Foreign Application Priority Data

Aug. 8, 2012   (JP) .................. 2012-175806

(51) Int. Cl.
*G01J 5/34* (2006.01)
*G01J 5/04* (2006.01)
*G01J 5/02* (2006.01)
(Continued)

(52) U.S. Cl.
CPC ............... *G01J 5/34* (2013.01); *G01J 5/0285* (2013.01); *G01J 5/045* (2013.01); *H05K 1/181* (2013.01); *H01L 2924/0002* (2013.01); *H05K 1/0219* (2013.01); *H05K 2201/0723* (2013.01); *H05K 2201/10151* (2013.01); *H05K 2201/10166* (2013.01); *H05K 2201/10515* (2013.01); *H05K 2201/2036* (2013.01); *Y02P 70/611* (2015.11)

(58) Field of Classification Search
USPC ....................................... 250/338.3
See application file for complete search history.

(56) References Cited

U.S. PATENT DOCUMENTS 4,437,002 A * 3/1984 Taniguchi et al. ......... 250/338.3
7,626,167 B2   12/2009 Hayashi et al.
(Continued)

FOREIGN PATENT DOCUMENTS

JP      63-118524 U    8/1988
JP      08-128895 A    5/1996
(Continued)

OTHER PUBLICATIONS

Japanese Office Action dated Apr. 18, 2013 (and English translation thereof) issued in counterpart Japanese Application No. 2012-175806.

*Primary Examiner* — Christine Sung
(74) *Attorney, Agent, or Firm* — Holtz, Holtz & Volek PC (57) ABSTRACT

An infrared sensor includes a circuit board, at least two support portions, a FET element and a pyroelectric element. The circuit board has an upper principal surface formed with plural electrodes. Each of the support portions has an upper surface, a lower surface, an upper conductive pattern formed on the upper surface and a lower conductive pattern formed on the lower surface. The upper conductive pattern is electrically connected with the lower conductive pattern. The lower conductive pattern is connected to an electrode of the upper principal surface of the circuit board. The FET element is located between the at least two support portions and arranged on the upper principal surface of the circuit board. The pyroelectric element is electrically connected with the upper conductive patterns of the support portions, and is supported by the support portions so as to be located above the FET element.

8 Claims, 7 Drawing Sheets

(51) Int. Cl.
  *H05K 1/18*  (2006.01)
  *H05K 1/02*  (2006.01)

(56) References Cited

U.S. PATENT DOCUMENTS

| | | |
|---|---|---|
| 7,897,921 B2 | 3/2011 | Horikawa et al. |
| 7,919,751 B2 | 4/2011 | Hayashi et al. |
| 2002/0000895 A1* | 1/2002 | Takahashi et al. ............ 333/133 |
| 2002/0122314 A1* | 9/2002 | Kojima et al. ................ 362/555 |
| 2002/0175285 A1* | 11/2002 | Ito et al. ..................... 250/338.3 |
| 2002/0179327 A1* | 12/2002 | Araki ............................ 174/260 |
| 2008/0073739 A1* | 3/2008 | Kitamura et al. ............. 257/433 |
| 2010/0044568 A1* | 2/2010 | Ishii et al. .................. 250/338.3 |

FOREIGN PATENT DOCUMENTS

| | | | |
|---|---|---|---|
| JP | 08-278196 A | | 10/1996 |
| JP | 11-040707 A | | 2/1999 |
| JP | 2000-124349 A | | 4/2000 |
| JP | 2004-028764 A | | 1/2004 |
| JP | 2009-128227 A | | 6/2009 |
| JP | 2010-016222 A | | 1/2010 |
| JP | 2012-037250 A | | 2/2012 |
| JP | 2012-122908 A | | 6/2012 |
| JP | 2012-132764 A | | 7/2012 |
| JP | 2012132764 A | * | 7/2012 |
| JP | 2013-050359 A | | 3/2013 |
| WO | WO 2006/112122 A1 | | 10/2006 |
| WO | WO 2006/120863 A1 | | 11/2006 |
| WO | WO 2007/125664 A1 | | 11/2007 |

* cited by examiner

INFRARED SENSOR

CROSS REFERENCE TO RELATED APPLICATIONS

An applicant claims priority under 35 U.S.C. §119 of Japanese Patent Application No. JP2012-175806 filed Aug. 8, 2012.

BACKGROUND OF THE INVENTION

This invention relates to an infrared sensor comprising a pyroelectric element.

For example, this type of infrared sensor is disclosed in each of JP-A 2012-122908 (Patent Document 1), JP-A 2012-37250 (Patent Document 2) and WO 2006/120863 (Patent Document 3), contents of which are incorporated herein by reference.

The infrared sensor of each of Patent Documents 1 to 3 comprises a pyroelectric element and a FET driven by the pyroelectric element.

SUMMARY OF THE INVENTION

It is an object of the present invention to provide an infrared sensor arrangeable within a reduced space.

One aspect of the present invention provides an infrared sensor comprising a circuit board, at least two support portions, a FET element and a pyroelectric element. The circuit board has an upper principal surface formed with a plurality of electrodes. Each of the support portions has an upper surface and a lower surface in a vertical direction, Each of the support portions further has an upper conductive pattern formed on the upper surface and a lower conductive pattern formed on the lower surface. The upper conductive pattern is electrically connected with the lower conductive pattern. The lower conductive pattern is connected to the electrode of the upper principal surface of the circuit board. The FET element is located between the at least two support portions and arranged on the upper principal surface of the circuit board. The pyroelectric element is electrically connected with the upper conductive patterns of the support portions. The pyroelectric element is supported by the support portions so as to be located above the FET element.

An appreciation of the objectives of the present invention and a more complete understanding of its structure may be had by studying the following description of the preferred embodiment and by referring to the accompanying drawings.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Referring to FIGS. 1 to 4, an infrared sensor 10 according to an embodiment of the present invention is a surface mounted type. However, the present invention is not limited to the present embodiment. For example, the infrared sensor 10 may be a through-hole mounted type similar to Patent Document 2.

As shown in FIGS. 1 to 4, the infrared sensor 10 according to the present embodiment comprises a multilayered printed circuit board (circuit board) 20, a FET element 60 arranged on the multilayered printed circuit board 20, a spacer block 70 surrounding the FET element 60, a sealing resin 80 sealing the FET element 60 in the spacer block 70, a pyroelectric element 90 supported by the spacer block 70 via a conductive adhesive 100, a shield case 110 made of a metal and arranged on the multilayered printed circuit board 20, a coating resin 120 covering the shield case 110, and an infrared transmitting filter 130 attached to the shield case 110.

Figure 2:
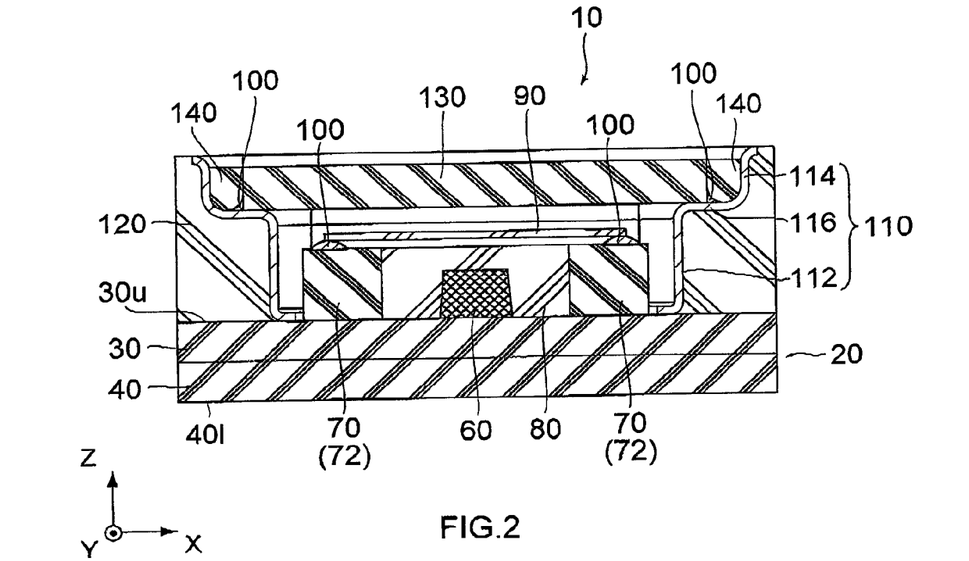
FIG. 2 is a cross-sectional view showing the infrared sensor of FIG. 1, taken along line II-II.
Figure 3:
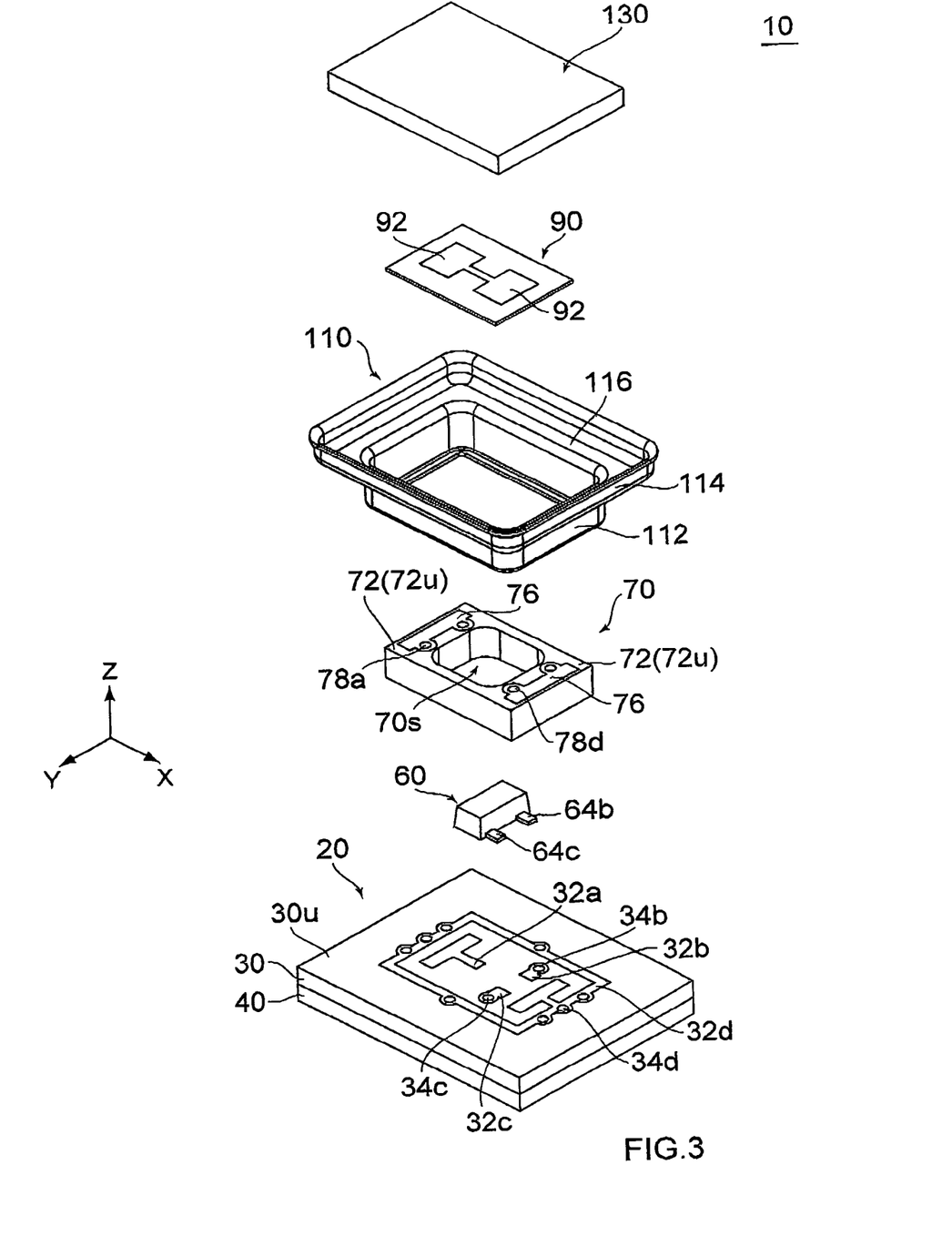
FIG. 3 is an exploded, perspective view showing the infrared sensor of FIG. 1, wherein a coating resin, a sealing resin, an conductive adhesive and an adhesive of the infrared sensor are not illustrated.
Figure 4:
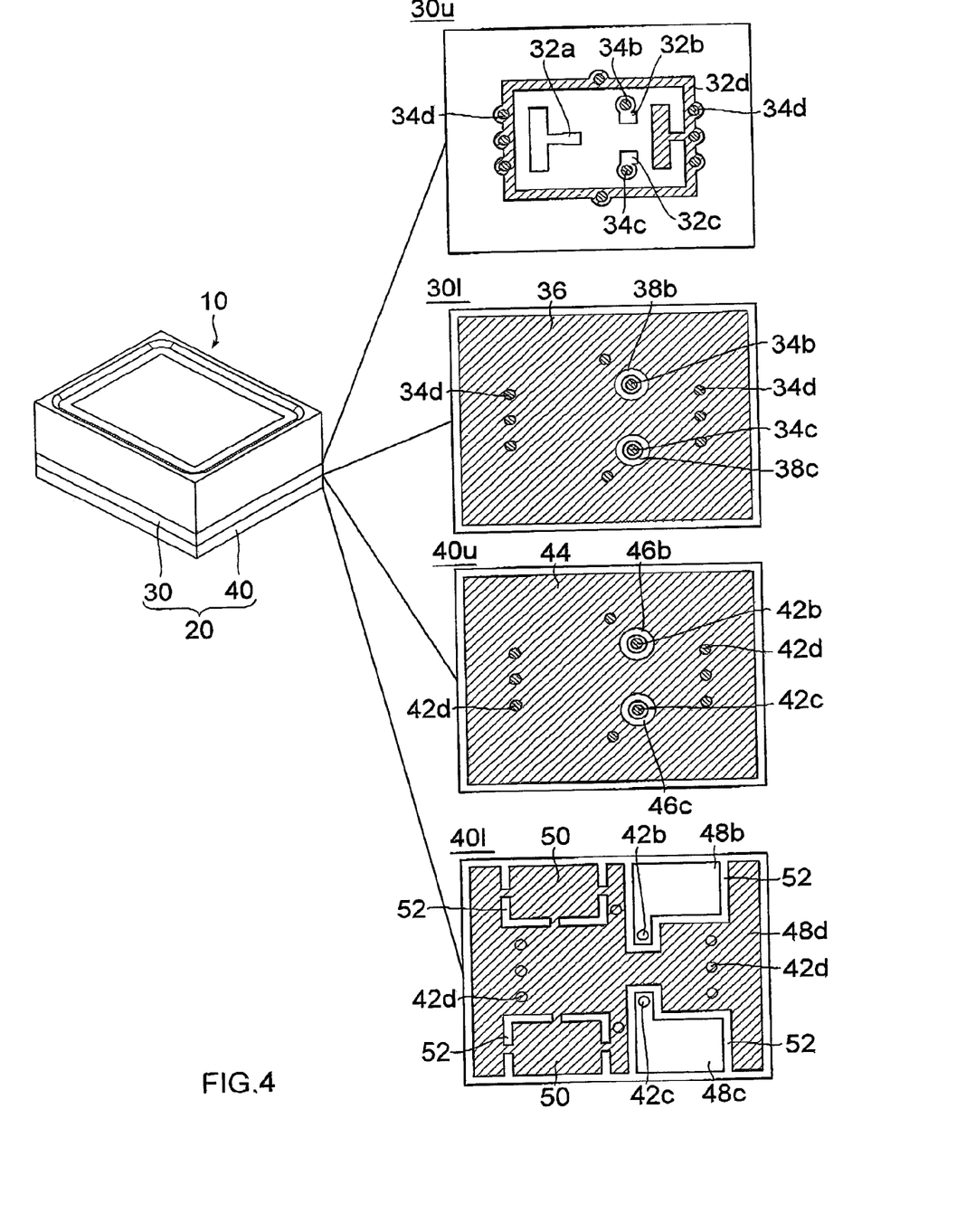
FIG. 4 is a schematic view mainly showing an arrangement of electrodes in each of planes of a multilayered printed circuit board of the infrared sensor of FIG. 1, wherein some of the electrodes are hatched for easier understanding.

As shown in FIGS. 1 to 4, the multilayered printed circuit board 20 according to the present embodiment is, for example, a glass epoxy circuit board formed from FR-4 which is popular and low-cost. The multilayered printed circuit board 20 is constituted from two double printed boards, namely, a first circuit board 30 and a second circuit board 40. As best shown in FIG. 4, the first circuit board 30 has a first upper principal surface 30$u$ and a first lower principal surface 30$l$ while the second circuit board 40 has a second upper principal surface 40$u$ and a second lower principal surface 40$l$. As can be seen from FIG. 2, the first upper principal surface 30$u$ is the upper principal surface of the multilayered printed circuit board 20 while the second lower principal surface 40$l$ is the lower principal surface of the multilayered printed circuit board 20.

As shown in FIG. 4, the first upper principal surface 30$u$ of the first circuit board 30 is formed with a plurality of electrodes 32$a$, 32$b$, 32$c$ and 32$d$ while the first lower principal surface 30$l$ is formed with a first inner conductive plane (inner conductive plane) 36. The first circuit board 30 is further formed with a plurality of through holes 34$b$, 34$c$ and 34$d$.

Each of the through holes 34b, 34c and 34d according to the present embodiment is wholly filled with a first filler made of a conductive or non-conductive resin. In other words, each of the through holes 34b, 34c and 34d according to the present embodiment has no space which is not filled with the first filler. The first fillers and the through holes 34b, 34c and 34d have first ends on the first upper principal surface 30u. The first ends of the first fillers and the first ends of the through holes 34b, 34c and 34d are plated.

The electrode 32a has a T-like shape. In detail, the electrode 32a consists of three end portions and a remaining portion which includes a connected part of the T-like shape as a main part, wherein the three end portions are exposed on the first upper principal surface 30u, and the remaining portion is applied with a solder resist. As described later, another portion, which is other than the electrode 32a, is also applied with a solder resist. The solder resist formed on the aforementioned another portion is illustrated as necessary in some figures. However, the solder resist formed on the electrode 32a is not illustrated in any figures so that the relation of connection of the electrode 32a is more clearly shown. The electrodes 32b and 32c are connected to the through holes 34b and 34c, respectively. The electrode 32d has a frame-like portion and a T-like portion, wherein the frame-like portion encloses the electrodes 32a, 32b and 32c, and the T-like portion extends inward from the frame-like portion. The electrode 32d is connected to the eight through holes 34d. As described later, the electrode 32d and the through holes 34d are grounded when the infrared sensor 10 is used.

The first inner conductive plane 36 is located in a first inner layer of the multilayered circuit board 20. The through holes 34b and 34c, which are connected to the electrodes 32b and 32c, reach at the first inner layer so that the first inner layer has two (i.e. a plurality of) first predetermined areas. Each of the first predetermined areas consists of one of cross-sections of the through holes 34b and 34c, and one of regions 38b and 38c which enclosing the cross-sections of the through holes 34b and 34c, respectively. The first inner conductive plane 36 entirely covers the first inner layer of the multilayered circuit board 20 except the first predetermined areas. Thus the first inner conductive plane 36 is separated from the through holes 34b and 34c by the region 38b and 38c. On the other hands, the eight through holes 34d are connected to the first inner conductive plane 36.

The second upper principal surface 40u of the second circuit board 40 is formed with a second inner conductive plane (inner conductive plane) 44 while the second lower principal surface 40l is formed with a plurality of electrodes 48b, 48c and 48d. The second circuit board 40 is further formed with a plurality of through holes 42b, 42c and 42d. Each of the through holes 42b, 42c and 42d according to the present embodiment is wholly filled with a second filler made of a conductive or non-conductive resin. In other words, each of the through holes 42b, 42c and 42d according to the present embodiment has no space which is not filled with the second filler. The second fillers and the through holes 42b, 42c and 42d have second ends on the second lower principal surface 40l. The second ends of the second fillers and the second ends of the through holes 42b, 42c and 42d are plated.

The second inner conductive plane 44 is located in a second inner layer of the multilayered circuit board 20. The through holes 42b and 42c reach at the second inner layer so that the second inner layer has two (i.e. a plurality of) second predetermined areas. Each of the second predetermined areas consists of one of cross-sections of the through holes 42b and 42c, and one of regions 46b and 46c which enclosing the cross-sections of the through holes 42b and 42c, respectively.

The second inner conductive plane 44 entirely covers the second inner layer of the multilayered circuit board 20 except the second predetermined areas. Thus, the second inner conductive plane 44 is separated from the through holes 42b and 42c by the region 46b and 46c. On the other hands, the eight through holes 42d are connected to the second inner conductive plane 44.

The first inner conductive plane 36 and the second inner conductive plane 44 are put on each other so as to function as a shield pattern almost entirely covering the inner layers (i.e. the first inner layer and the second inner layer) of the multilayered printed circuit board 20.

The electrodes 48b and 48c are connected to the through holes 42b and 42c, respectively. As can be seen from the aforementioned relation of connection, the electrodes 48b and 48c function as input and output terminals of the infrared sensor 10. in detail, the electrodes 48b and 48c are connected with a drain terminal (terminal) 64b and a source terminal (terminal) 64c, respectively. The electrode 48d is connected to the eight through holes 42d. The electrode 48d is a ground pattern. The electrode 48d is separated from the electrodes 48b and 48c by solder resist regions 52. The electrode 48d is provided with solder regions 50. Although each of the solder regions 50 is electrically connected with a remaining part of the electrode 48d, each of the solder regions 50 is divided from the remaining part of the electrode 48d by the solder resist region 52 so as to be distinguishable as a rectangular region.

According to the present embodiment, each of the through holes 34b, 34c, 34d, 42b, 42c and 42d is buried. Moreover, each of the through holes 34b, 34c and 34d is plated at the upper principal surface (the first upper principal surface 30u) and each of the through holes 42b, 42c and 42d is plated at the lower principal surface (the second lower principal surface 40l). Accordingly, it is prevented that an undesirable environment such as humidity is transferred from the lower principal surface (the second lower principal surface 40l) to the upper principal surface (the first upper principal surface 30u) of the multilayered printed circuit board 20.

Figure 5:
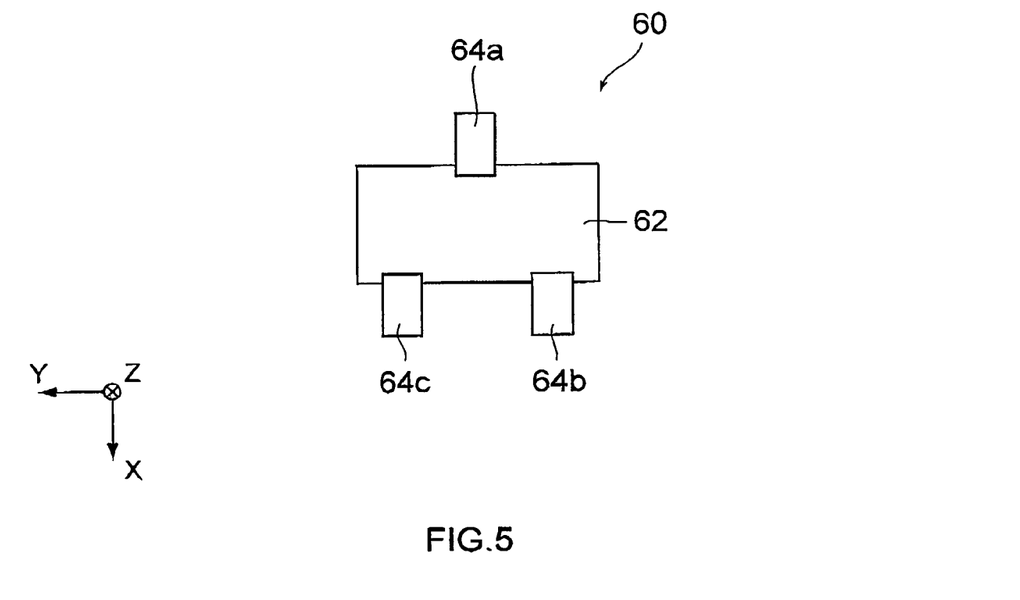
FIG. 5 is a bottom view showing a FET element of the infrared sensor of FIG. 1.

As shown in FIGS. 2, 3 and 5, the FET element 60 is a surface mounted type. The FET element 60 is mountable on a surface by using an automatic component feeder. In detail, the FET element 60 has an upper surface which is formed planarly so as to be able to be picked up by a vacuum chuck of the automatic component feeder. The FET element 60 also has a bottom surface 62 and three (i.e. a plurality of) terminals, namely, a gate terminal (terminal) 64a, the drain terminal 64b and the source terminal 64c located on the bottom surface 62. The FET element 60 is conveyed to be mounted on the upper principal surface (the first upper principal surface 30u) by the automatic component feeder. Thus, the FET element 60 is arranged on the upper principal surface (the first upper principal surface 30u) of the multilayered printed circuit board 20 in a state where the bottom surface 62 faces the upper principal surface (the first upper principal surface 30u) of the multilayered printed circuit board 20. Then, the gate terminal 64a, the drain terminal 64b and the source terminal 64c are connected to the electrode 32a, 32b and 32c, respectively.

Figure 6:
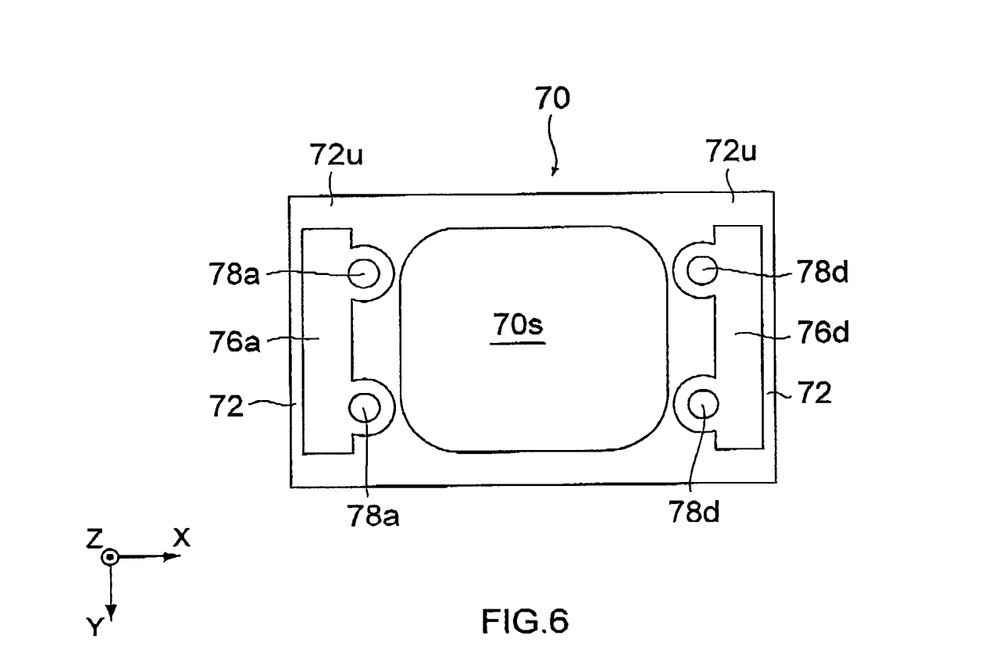
FIG. 6 is a top view showing a spacer block of the infrared sensor of FIG. 1.
Figure 7:
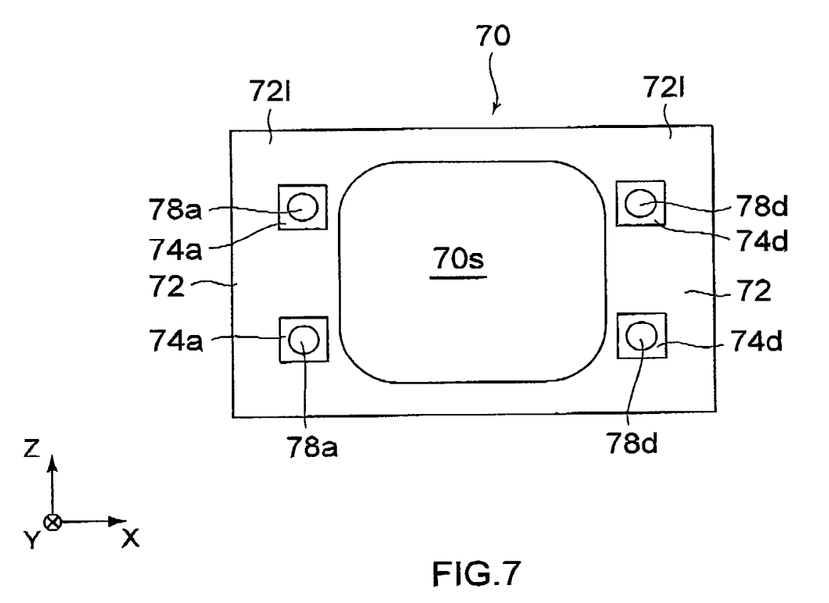
FIG. 7 is a bottom view showing the spacer block of FIG. 6.

As shown in FIGS. 3, 6 and 7, the spacer block 70 according to the present embodiment is mainly made of a resin. The spacer block 70 has a closed frame-like shape having an inside space 70s therewithin. The spacer block 70 has two portions opposite to each other in the X-direction. As described later, the two portions function as support portions 72 which support the pyroelectric element 90. Each of the support portions 72 has an upper surface 72u and a lower surface 72l in the Z-direction (vertical direction). Each of the support portions 72 further has lower conductive patterns 74a and 74d formed on the lower surface 72l, and upper conductive patterns 76a and 76d formed on the upper surface 72u. Each of the lower conductive patterns 74a and 74d according to the present embodiment has two electrodes (see FIG. 7). Each of the upper conductive patterns 76a and 76d has a single electrode having a rectangular shape (see FIG. 6). The lower conductive pattern 74a is electrically connected with the upper conductive pattern 76a via through holes 78a while the lower conductive pattern 74d is electrically connected with the upper conductive pattern 76d via through holes 78d. The spacer block 70 is mounted on the upper principal surface (the first upper principal surface 30u) of the multilayered printed circuit board 20. The lower conductive pattern 74a is connected to opposite ends of top of the T-like shape of the electrode 32a. The lower conductive pattern 74d is connected to top of the T-like portion of the electrode 32d.

The FET element 60 is arranged in the inside space 70s of the spacer block 70. The sealing resin 80 fills the inside space 70s to seal the FET element 60 arranged in the inside space 70s. According to the present embodiment, the sealing resin 80 wholly fills the inside space 70s of the spacer block 70. Especially, the connected parts where the gate terminal 64a, drain terminal 64b and the source terminal 64c are connected to the respective electrodes 32a, 32b and 32c are entirely covered by the sealing resin 80. Accordingly, for example, even when the infrared sensor 10 is used under a high-humidity environment for a long time, the gate terminal 64a, the drain terminal 64b and the source terminal 64c of the FET element 60 are protected by the sealing resin 80 so that the insulation resistance between the terminals are kept at a predetermined value. According to the present embodiment, the sealing by the sealing resin 80 prevents the insulation resistance between the terminals from being degraded so that the infrared sensor 10 shows steady performance.

The sealing resin 80 according to the present embodiment has coefficient of linear expansion of $9.9 \times 10^{-6}/°C$. Thus, the coefficient of linear expansion of the sealing resin 80 is about same as the coefficient of linear expansion of the multilayered printed circuit board 20 which is a glass epoxy circuit board. According to the present embodiment, a resin, which has the coefficient of linear expansion near to the coefficient of linear expansion of the multilayered printed circuit board 20, is used as the sealing resin 80 so that it is possible to prevent the sealing by the sealing resin 80 from being degraded even under a rough environment. More specifically, when a resin, which has the coefficient of linear expansion near to the coefficient of linear expansion of the multilayered printed circuit board 20, is used as the sealing resin 80, the aforementioned protection of the terminals by the sealing resin 80 may be maintained for a long time. The aforementioned value of $9.9 \times 10^{-6}/°C$. is one of preferable values of the coefficient of linear expansion. In other words, a resin, which has coefficient of linear expansion different from $9.9 \times 10^{-6}/°C$., may be used as the sealing resin 80. However, the coefficient of linear expansion of the sealing resin 80 is preferred to be between $5 \times 10^{-6}/°C$. and $20 \times 10^{-6}/°C$. Otherwise, when the sealing resin 80 expands under an environment of high temperature and high humidity, the aforementioned protection by the sealing of the terminals of the FET element 60a might be destroyed by stress caused from difference between expansions.

According to the present embodiment, the FET element 60 is arranged within the inside space 70s of the spacer block 70 so that the sealing resin 80 effectively seals the FET element 60. According to the present embodiment, the FET element 60 is entirely covered with the sealing resin 80 which is fixed to the upper principal surface (the first upper principal surface 30u) of the multilayered printed circuit board 20.

Figure 8:
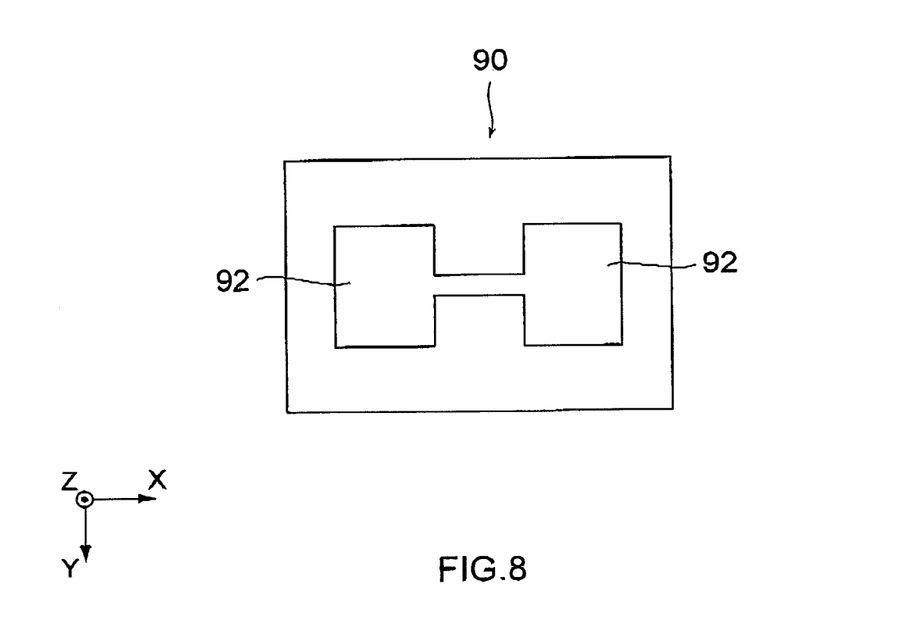
FIG. 8 is a top view showing a pyroelectric element of the infrared sensor of FIG. 1.
Figure 9:
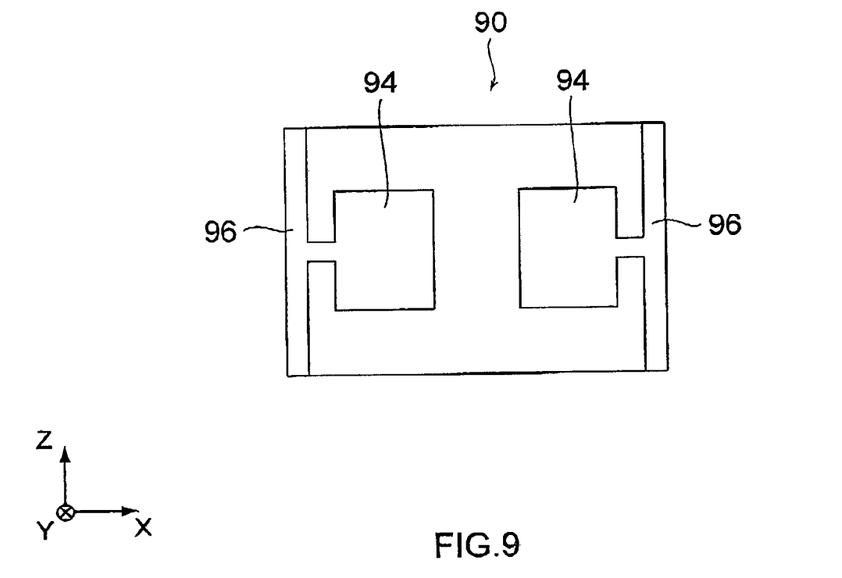
FIG. 9 is a bottom view showing the pyroelectric element of FIG. 8.

As shown in FIGS. 8 and 9, the pyroelectric element 90 has two sets each consists of an upper electrode 92 and a lower electrode 94. As can be seen from FIG. 8, the two upper electrodes 92 are coupled with each other. As can be seen from FIG. 9, the two lower electrodes 94 are connected to respective connection patterns 96. As can be seen from FIGS. 3, 8 and 9, the infrared sensor 10 according to the present embodiment is a so-called dual-type. As shown in FIG. 2, the pyroelectric element 90 is connected and fixed to the support portions 72 of the spacer block 70 by using a conductive adhesive 100. In detail, one of the connection patterns 96 is electrically connected with and fixed to the upper conductive pattern 76a of one of the support portions 72 by the conductive adhesive 100 while a remaining one of the connection patterns 96 is electrically connected with and fixed to the upper conductive pattern 76d of a remaining one of the support portions 72 by the conductive adhesive 100. Thus, the pyroelectric element 90 is supported by the support portions 72 so as to be located above (i.e. at the positive Z-side of) the FET element 60. Accordingly, a mounting area of the infrared sensor 10 may be reduced. More specifically, according to the present embodiment, the area of the lower principal surface 40l of the multilayered printed circuit board 20 of the infrared sensor 10 may be reduced. As described above, the FET element 60 and the pyroelectric element 90 are arranged to be in line in the vertical direction so that it is possible to reduce a size of the multilayered printed circuit board 20. Accordingly, the infrared sensor 10 may have reduced size.

As shown in FIGS. 2 and 3, the shield case 110 is arranged on the upper principal surface (the first upper principal surface 30u) of the multilayered printed circuit board 20 so as to surround and cover the FET element 60, the spacer block 70 (i.e. the support portions 72) and the pyroelectric element 90. The shield case 110 according to the present embodiment, unlike the infrared sensor of Patent Document 3, is not formed by bending a punched out metal sheet. Thus, the shield case 110 has neither a break nor a gap in a cover part thereof. The infrared sensor 10 according to the present embodiment therefore has a superior noise resistance characteristic as compared with the infrared sensor of Patent Document 3.

As shown in FIG. 2, the shield case 110 has a lower case 112, an upper case 114 located above (i.e. at the positive Z-side of) the lower case 112, and a boundary portion 116 located at a boundary between the lower case 112 and the upper case 114. The lower case 112 is connected to the electrode 32d at the upper principal surface (the first upper principal surface 30u) of the multilayered printed circuit board 20. The lower case 112 is smaller than the upper case 114 in the XY-plane. In detail, the lower case 112 has a lower area in the XY-plane while the upper case 114 has an upper area in the XY-plane, wherein the lower area is smaller than the upper area. Accordingly, the boundary portion 116 opens upward (in the positive Z-direction). The FET element 60, the spacer block 70 (i.e. the support portions 72) and the pyroelectric element 90 are located within a room surrounded by the lower case 112 (i.e. within the lower case 112). According to the present embodiment, although the infrared sensor 10 has a large opening portion constituted from the upper case 114, each of the FET element 60 and the pyroelectric element 90 is located at short distance from the shield case 110. The infrared sensor 10 according to the present embodiment therefore has more superior noise resistance.

Figure 1:
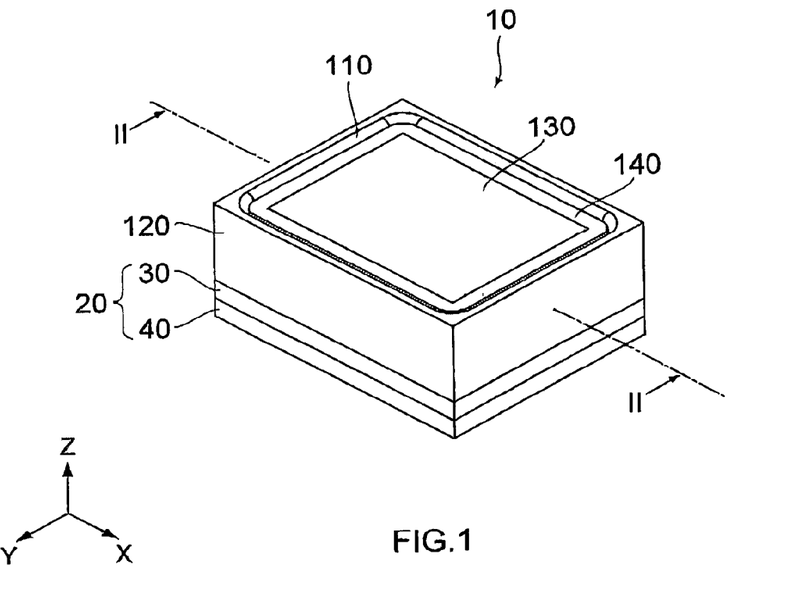
FIG. 1 is a perspective view showing an infrared sensor according to an embodiment of the present invention.

As shown in FIGS. 1 and 2, the coating resin 120 is fixed to the upper principal surface (the first upper principal surface 30u) of the multilayered printed circuit board 20 and covering the shield case 110 from outside. Accordingly, the shield case 110 is connected and fixed to the multilayered printed circuit board 20 not only by soldering but also by the coating resin 120. The coating resin 120 is made of a resin such as an epoxy resin which is not broken even in a reflow oven for soldering. When the infrared sensor 10 according to the present embodiment is installed on a circuit board (not shown), the infrared sensor 10 is placed in the reflow oven. Even if the solder, which connects the shield case 110 to the multilayered printed circuit board 20, is remelted in the reflow oven, the coating resin 120 may keep the shield case 110 and the multilayered printed circuit board 20 being fixed to each other. Accordingly, the room where the pyroelectric element 90 and the FET element 60 are accommodated may be kept airtight. Moreover, the shield case 110 made of a metal, which is susceptible to temperature change of an external environment, is covered with the coating resin 120 so that the temperature change of the external environment does not affect largely.

As shown in FIG. 2, the boundary portion 116 is located under the infrared transmitting filter 130. The boundary portion 116 supports the infrared transmitting filter 130. In detail, the infrared transmitting filter 130 is mounted on the boundary portion 116 from above (i.e. along the negative Z-direction). The infrared transmitting filter 130 is connected with and fixed to the shield case 110 by using the conductive adhesive 100. A gap, which is remained between the infrared transmitting filter 130 and the shield case 110 after the aforementioned fixing by the conductive adhesive 100, is filled by an adhesive 140. Thus, the room where the pyroelectric element 90 is accommodated becomes more airtight.

Figure 10:
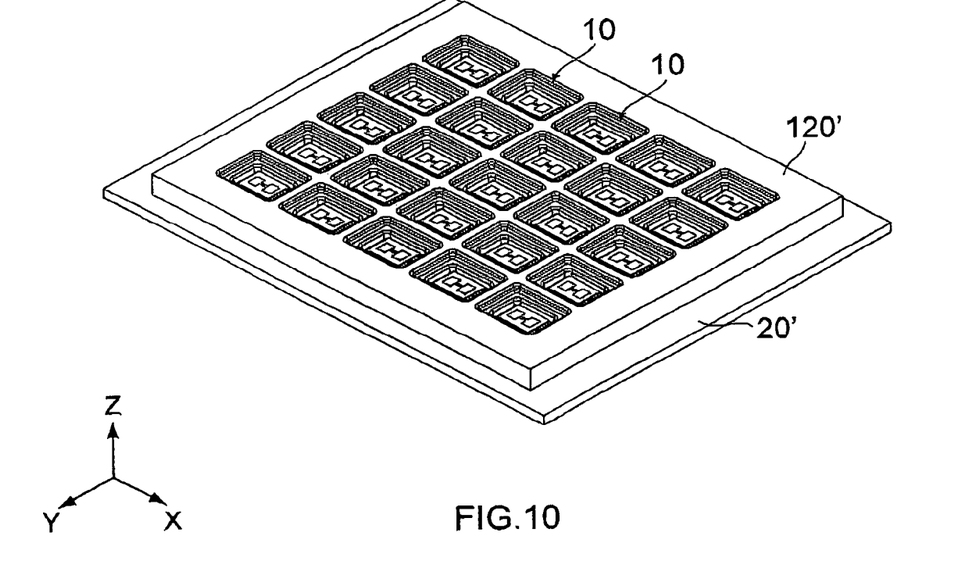
FIG. 10 is a perspective view showing a plurality of the pyroelectric elements arranged on a primary circuit board, wherein the pyroelectric elements are in a manufacturing process.

The infrared sensor 10 having the aforementioned structure is manufactured as described below. As shown in FIG. 10, a plurality of the infrared sensors 10 are simultaneously formed on a primary circuit board 20'. Then, the primary circuit board 20' is cut into multiple pieces of infrared sensors 10 in a dicing process. In detail, a solder paste is printed on the primary circuit board 20' which is divisible Into a plurality of the multilayered printed circuit boards 20. Then, an automatic component feeder places the FET elements 60, the spacer blocks 70 and the shield cases 110 on the primary circuit board 20' (i.e. on the multilayered printed circuit boards 20) in this order. Then, the solder paste is melt in the reflow oven so that the FET elements 60, the spacer blocks 70 and the shield cases 110 are fixed on the primary circuit board 20' (i.e. on the multilayered printed circuit boards 20). Then, the sealing resin 80 is poured into each of the inside spaces 70s to fill the inside space 70s between the FET element 60 and the spacer block 70. Then, the coating resin 120 is poured to cover the shield cases 110. Then, the conductive adhesive 100 is applied on each of the spacer blocks 70. Then, the pyroelectric elements 90 are attached to the respective spacer blocks 70. Then, the infrared transmitting filters 130 are installed to the respective shield cases 110. In detail, the infrared transmitting filter 130 and the shield case 110 are fixed to each other by the conductive adhesive 100 and the adhesive 140. Then, the primary circuit board 20' is cut into the multiple pieces of the infrared sensors 10 in the dicing process.

As can be seen from the above description, according to the present embodiment, the infrared sensor 10 is assembled by stacking the components on the multilayered printed circuit board 20 in regular order. Accordingly, the multiple infrared sensors 10 are formed simultaneously and efficiently on the primary circuit board 20'.

The present invention is not limited to the aforementioned embodiment. The present invention is variously modifiable and applicable.

For example, the spacer block 70 according to the aforementioned embodiment has the closed frame-like shape. However, the spacer block 70 may have an open shape. For example, the spacer block 70 may have a C-like shape. Moreover, the aforementioned spacer block 70 has the two support portions 72 and coupling portions which couple the support portions 72 with each other. However, the spacer block 70 may be constituted only from the two support portions 72. In this case, the two support portions 72 are arranged to be apart from each other while the FET element 60 is provided between the support portions 72. Moreover, the infrared sensor 10 may have three or more support portions 72. In any case, the FET element 60 is located between the at least two support portions 72. In any case, it is preferred that the FET element 60, especially, the connection parts of the terminals 64a, 64b and 64c of the FET element 60 which are connected to the electrodes 32a, 32b and 32c of the multilayered printed circuit board 20, be entirely covered with the sealing resin 80 so as not to be exposed to a high humidity atmosphere.

EXAMPLE

Figure 11:
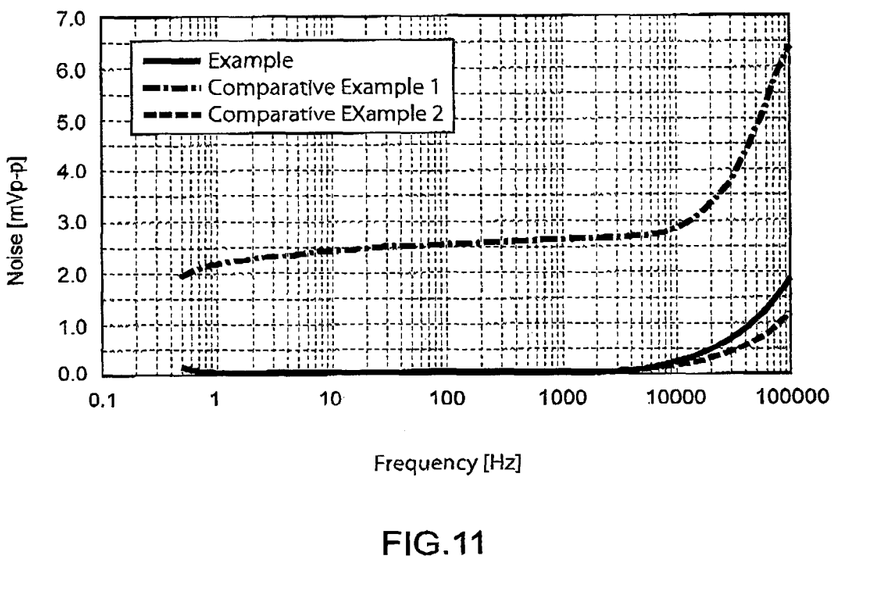
FIG. 11 is a graph showing a noise resistance characteristic of an infrared sensor which is Example of the present invention.

The infrared sensor 10 having the structure according to the aforementioned embodiment was made as Example. In addition, an infrared sensor having a structure disclosed in Patent Document 3 and an infrared sensor having a structure disclosed in Patent Document 2 were prepared as Comparative Example 1 and Comparative Example 2, respectively In addition, an infrared sensor having a structure similar to Example was prepared as Comparative Example 3. The FET element 60 of Comparative Example 3 was sealed with a resin having coefficient of linear expansion over $20 \times 10^{-6}$°C. instead of the sealing resin 80 having coefficient of linear expansion of $9.9 \times 10^{-6}$/°C. A noise resistance characteristic of each of Example, Comparative Example 1 and Comparative Example 2 was measured under a condition where low frequency noise was applied. Voltage of the source terminal 64c of each of Example and Comparative Example 3 was measured after each of Example and Comparative Example 3 is placed under an environment of high temperature (specifically, 60° C.) and high humidity (specifically, 95%) for a period. The results of measurements are shown in FIGS. 11 and 12, respectively.

The shield case 110 of the infrared sensor 10 of Example is not formed by bending a metal sheet so that the covering part of the shield case 110 of Example is formed with no break and no gap unlike the infrared sensor of Comparative Example 1 (Patent Document 3). Accordingly, as apparent from FIG. 11, the infrared sensor 10 of Example has a noise resistance characteristic superior than the infrared sensor of Comparative Example 1, which is a surface mounted type similar to the infrared sensor 10 of Example. Moreover, the infrared sensor 10 of Example has a noise resistance characteristic equivalent to the infrared sensor of Comparative Example 2, which is a through-hole mounted type and a CAN type.

Figure 12:
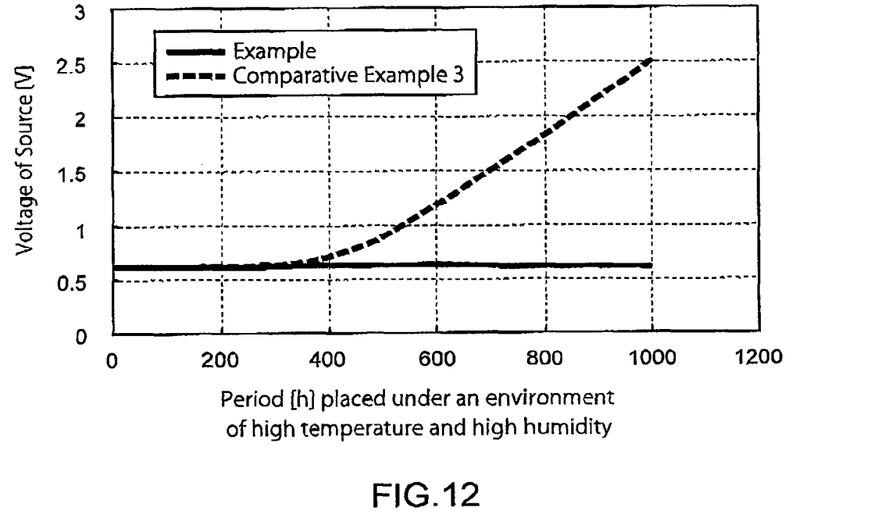
FIG. 12 is a graph for showing an effect caused by a sealing resin of the infrared sensor which is Example of the present invention.

As can be seen from FIG. 12, Example shows almost unchanged and steady voltage of the source terminal 64c when the period is equal to or less than 1000 hours. On the other hand, voltage of the source terminal 64c of Comparative Example 3 gradually increases when the period is equal to or more than 250 hours. It is because the sealing resin of Comparative Example 3 expands under the environment of high humidity so that the protection of the terminal is degraded.

The present application is based on a Japanese patent application of JP2012-175806 filed before the Japan Patent Office on Aug. 8, 2012, the content of which is incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. An infrared sensor comprising:
a circuit board having an upper principal surface formed with a plurality of electrodes;
at least two support portions, each of the support portions having an upper surface and a lower surface in a vertical direction, each of the support portions further having an upper conductive pattern formed on the upper surface and a lower conductive pattern formed on the lower surface, the upper conductive pattern being electrically connected with the lower conductive pattern, and the lower conductive pattern being connected to at least one of the plurality of electrodes of the upper principal surface of the circuit board;
a FET element located between the at least two support portions and arranged on the upper principal surface of the circuit board;
a pyroelectric element electrically connected with the upper conductive patterns of the support portions, the pyroelectric element being supported by the support portions so as to be located above the FET element;
a shield case made of a metal, the shield case being arranged on the upper principal surface of the circuit board and surrounding the pyroelectric element, the support portions, and the FET element; and
a coating resin fixed to the upper principal surface of the circuit board and covering the shield case from an outside of the shield case;
wherein the FET element is entirely covered with a sealing resin which is fixed to the upper principal surface of the circuit board; and
wherein the infrared sensor further comprises a spacer block which has a closed frame-like shape having an inside space therewithin, and the support portions are respective parts of the spacer block, the FET element is arranged in the inside space of the spacer block, and the sealing resin fills the inside space of the spacer block to seal the FET element.

2. The infrared sensor as recited in claim 1, wherein:
the circuit board is a glass epoxy circuit board; and
the sealing resin has a coefficient of linear expansion between $5 \times 10^{-6}/°$ C. and $20 \times 10^{-6}/°$ C.

3. The infrared sensor as recited in one of claim 1, wherein:
the circuit board is formed with a plurality of through holes;
each of the through holes is filled with a filler made of a conductive or non-conductive resin; and
the fillers and the through holes have ends on the upper principal surface of the circuit board, the ends of the fillers and the ends of the through holes being plated.

4. The infrared sensor as recited in claim 3, wherein:
the circuit board is a multilayered circuit board which has an inner conductive plane located in an inner layer of the multilayered circuit board;
the through holes reach at the inner layer so that the inner layer has a plurality of predetermined areas, each of the predetermined areas consists of a cross-section of the through hole and a region enclosing the cross-section of the through hole; and
the inner conductive plane entirely covering the inner layer of the multilayered circuit board except one or more predetermined areas.

5. The infrared sensor as recited in claim 1, further comprising an infrared transmitting filter attached to the shield case.

6. The infrared sensor as recited in claim 5, wherein:
the shield case has a lower case, an upper case, and a boundary portion located at a boundary between the upper case and the lower case;
the upper case has an upper area in a horizontal plane perpendicular to the vertical direction while the lower case has a lower area in the horizontal plane, the lower area being smaller than the upper area;
the pyroelectric element, the support portions, and the FET element are located within the lower case; and
the boundary portion is located under the infrared transmitting filter, the boundary portion supporting the infrared transmitting filter.

7. The infrared sensor as recited in claim 1, wherein:
the FET element is a surface mounted type, the FET element having a bottom surface and a plurality of terminals located on the bottom surface; and
the FET element is arranged on the upper principal surface of the circuit board, the bottom surface facing the upper principal surface, and the terminals being connected to the electrodes.

8. An infrared sensor comprising:
a circuit board having an upper principal surface formed with a plurality of electrodes;
at least two support portions, each of the support portions having an upper surface and a lower surface in a vertical direction, each of the support portions further having an upper conductive pattern formed on the upper surface and a lower conductive pattern formed on the lower surface, the upper conductive pattern being electrically connected with the lower conductive pattern, and the lower conductive pattern being connected to at least one of the plurality of electrodes of the upper principal surface of the circuit board;
a FET element located between the at least two support portions and arranged on the upper principal surface of the circuit board;
a pyroelectric element electrically connected with the upper conductive patterns of the support portions, the pyroelectric element being supported by the support portions so as to be located above the FET element; and
a spacer block having coupling portions which couple the support portions with each other,
wherein:
the FET element is entirely covered with a sealing resin which is fixed to the upper principal surface of the circuit board;
the spacer block has a closed frame-like shape having an inside space therewithin;
the support portions are respective parts of the spacer block;
the FET element is arranged in the inside space of the spacer block; and
the sealing resin fills the inside space of the spacer block to seal the FET element.

* * * * *